(12) United States Patent
Van Empel et al.

(10) Patent No.: US 7,113,262 B2
(45) Date of Patent: Sep. 26, 2006

(54) LITHOGRAPHIC APPARATUS, DEVICE MANUFACTURING METHOD, AND DEVICE MANUFACTURED THEREBY

(75) Inventors: Tjarko Adriaan Rudolf Van Empel, Eindhoven (NL); Aschwin Lodewijk Hendricus Johannes Van Meer, Roosendaal (NL); Koen Jacobus Johannes Maria Zaal, Eindhoven (NL); Ton Aantjes, Best (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/872,774

(22) Filed: Jun. 22, 2004

(65) Prior Publication Data

US 2005/0024620 A1   Feb. 3, 2005

(30) Foreign Application Priority Data

Jun. 23, 2003   (EP)   ................... 03076959

(51) Int. Cl.
   *G03B 27/58*   (2006.01)
   *G03B 27/42*   (2006.01)
(52) U.S. Cl. .......................... 355/72; 355/53
(58) Field of Classification Search ................. 355/53, 355/72–76; 310/10, 12; 361/234; 269/21
   See application file for complete search history.

(56) References Cited

U.S. PATENT DOCUMENTS

| 5,094,536 A | * | 3/1992 | MacDonald et al. ........ 356/514 |
| 5,563,683 A | | 10/1996 | Kamiya |
| 5,923,408 A | * | 7/1999 | Takabayashi ................. 355/53 |
| 6,257,564 B1 | * | 7/2001 | Avneri et al. ................. 269/21 |
| 6,413,701 B1 | | 7/2002 | van Empel et al. |
| 6,676,761 B1 | * | 1/2004 | Shang et al. ................. 118/728 |

FOREIGN PATENT DOCUMENTS

EP   1 077 393 A2   2/2001

OTHER PUBLICATIONS

Copy of European Search Report dated Jan. 8, 2004 for EP 03076959.0.

* cited by examiner

*Primary Examiner*—Henry Hung Nguyen
(74) *Attorney, Agent, or Firm*—Pillsbury Winthrop Shaw Pittman LLP

(57) ABSTRACT

A lithographic projection apparatus is disclosed. The apparatus includes a radiation system for providing a beam of radiation and a substrate holder for supporting a substrate to be placed in a beam path of the beam of radiation. The substrate holder includes a plurality of first protrusions, the distal ends thereof defining a first contact surface for contacting the substrate, and a plurality of second protrusions, the distal ends thereof defining a second contact surface for supporting the substrate. The second protrusions are arranged for preventing sticking of the substrate to the first contact surface during release of a clamping pressure so that (1) the substrate contacts the first and second contact surfaces when the substrate is clamped against the substrate holder, and (2) the substrate is supported by the second contact surface and distanced from the first contact surface when the substrate is not clamped.

17 Claims, 4 Drawing Sheets

LITHOGRAPHIC APPARATUS, DEVICE MANUFACTURING METHOD, AND DEVICE MANUFACTURED THEREBY

CROSS-REFERENCE TO RELATED APPLICATIONS

This application claims the benefit of priority from European Patent Application No. 03076959.0, filed Jun. 23, 2003, the content of which is incorporated herein by reference in its entirety.

BACKGROUND OF THE INVENTION

1. Field of the Invention

The present invention relates to a lithographic projection apparatus. More specifically, the present invention relates to a substrate support for a lithographic projection apparatus.

2. Description of Related Art

In order to achieve good image definition and layer overlay the irradiated surface of a substrate should be kept as flat and as stationary as possible during exposure of the substrate. Known lithographic apparatus addresses these demands using the substrate holder hereabove specified, on which a substrate can be placed so that its backside is in contact with the protrusions, all of which lie in a well-defined plane. For example, by connecting aperture(s) in the substrate holder to a vacuum generating device, the backside of the substrate can be clamped securely against the protrusions. The use of protrusions in this manner ensures that only a fraction of the area of the backside is actually pressed against a solid surface; in this way, the distorting effect of any particulate contamination on the backside of the wafer is minimized, since such contamination will most probably be situated in the empty spaces between protrusions rather than being pressed against the top surface of a protrusion.

Also, in this way, substantially every protrusion contacts the substrate, thus defining one single plane of support that is perfectly level and orientable into required directions. This also poses a problem since there remains a relatively large contact surface of the protrusions physically in contact with the substrate. This may introduce a binding force, in the art known as "sticking", between the top faces of the protrusions of the substrate holder and the backside of substrate. In practice, this means that once a substrate is clamped to the substrate holder and brought into position for a photolithographic irradiation process, releasing the substrate from the substrate holder can take a substantial amount of time causing costly delay in the availability of the machine for a next photolithographic routine. It even may cause jamming of the ejection mechanisms present to release the substrate from the substrate holder.

BRIEF SUMMARY OF THE INVENTION

One aspect of the present invention is aimed at minimizing these problems by providing a substrate holder where these sticking forces are not problematic.

In order to achieve this aspect, the embodiments of the invention provide a lithographic projection apparatus that includes: a radiation system for providing a projection beam of radiation; and a substrate holder for supporting a substrate to be placed in a beam path of the projection beam. The substrate holder includes a plurality of first protrusions the distal ends thereof defining a first contact surface for contacting a substrate. The substrate holder is provided with a clamping device for clamping the substrate against the substrate holder. The substrate holder includes a plurality of second protrusions, the distal ends thereof defining a second contact surface for supporting the substrate. The second protrusions are arranged so that the substrate contacts the first and the second contact surface when the substrate is clamped against the substrate holder and so that the wafer is supported by the second contact surface and distanced from the first contact surface when the substrate is not clamped, for preventing sticking to the first surface during release of the clamping device.

By providing the plurality of second protrusions, the sticking forces between the substrate and the substrate holder can be compensated to a desired extent or even be neutralized. Thus, when the clamping device is switched off so that the substrate is no longer clamped to the substrate holder, the binding forces between the substrate and substrate holder are reduced, due to a force provided by elastic deformation of the second protrusions and the wafer that contacts the protrusions.

In a preferred embodiment, the plurality of second protrusions is arranged on top of the plurality of first protrusions. Here, preferably, the second contact surface is smaller than the first contact surface. In this respect, it is noted that where the top surface of the first plurality of protrusions may be substantially flat in terms of surface roughness of a substrate, the top surface of the second plurality of protrusions may be of a less flat nature. By minimizing the contact surface of the second plurality of protrusions, the sticking forces that remain through contact forces between the substrate and the second plurality of protrusions can be minimized.

As a preferred embodiment, each of the first protrusions is provided with a second protrusion, and the first and second protrusions are cylindrical. A ratio of diameters of the second protrusions and first protrusions may range between about 0.01 and about 0.5.

Depending on the ratio of diameters, the distance between the first and second contact surfaces may vary. Preferable ranges are between about 6–400 nm when the substrate is not clamped against the first contact surface. In this aspect, it is noted that with the distance, a difference in height between first and second plurality of protrusions is indicated, where, viewed from a flat reference plane, the heights of first and second plurality of protrusions are two discrete values. If the ratio of diameters is large, the distance may be small, and vice-versa.

A practical embodiment includes cylindrical first protrusions of about 0.5 mm, and second protrusions on top thereof having a diameter of about 0.05 mm and the distance between the first and second contact surfaces has a value in the range of about 50–80 nm.

In another embodiment, a device manufacturing method is provided. The method includes supporting a substrate with a substrate support. The substrate support includes a plurality of first protrusions, the distal ends thereof defining a first contact surface for contacting the substrate, and a plurality of second protrusions, the distal ends thereof defining a second contact surface for supporting the substrate. The method also includes clamping the substrate to the substrate support so that the substrate contacts the first and second contact surfaces, patterning a beam of radiation with a patterning device; projecting the patterned beam of radiation onto a target portion of the substrate; and unclamping the substrate so that the substrate is supported by the second contact surface and distanced from the first contact surface. This embodiment encompasses devices that are manufactured by this method.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
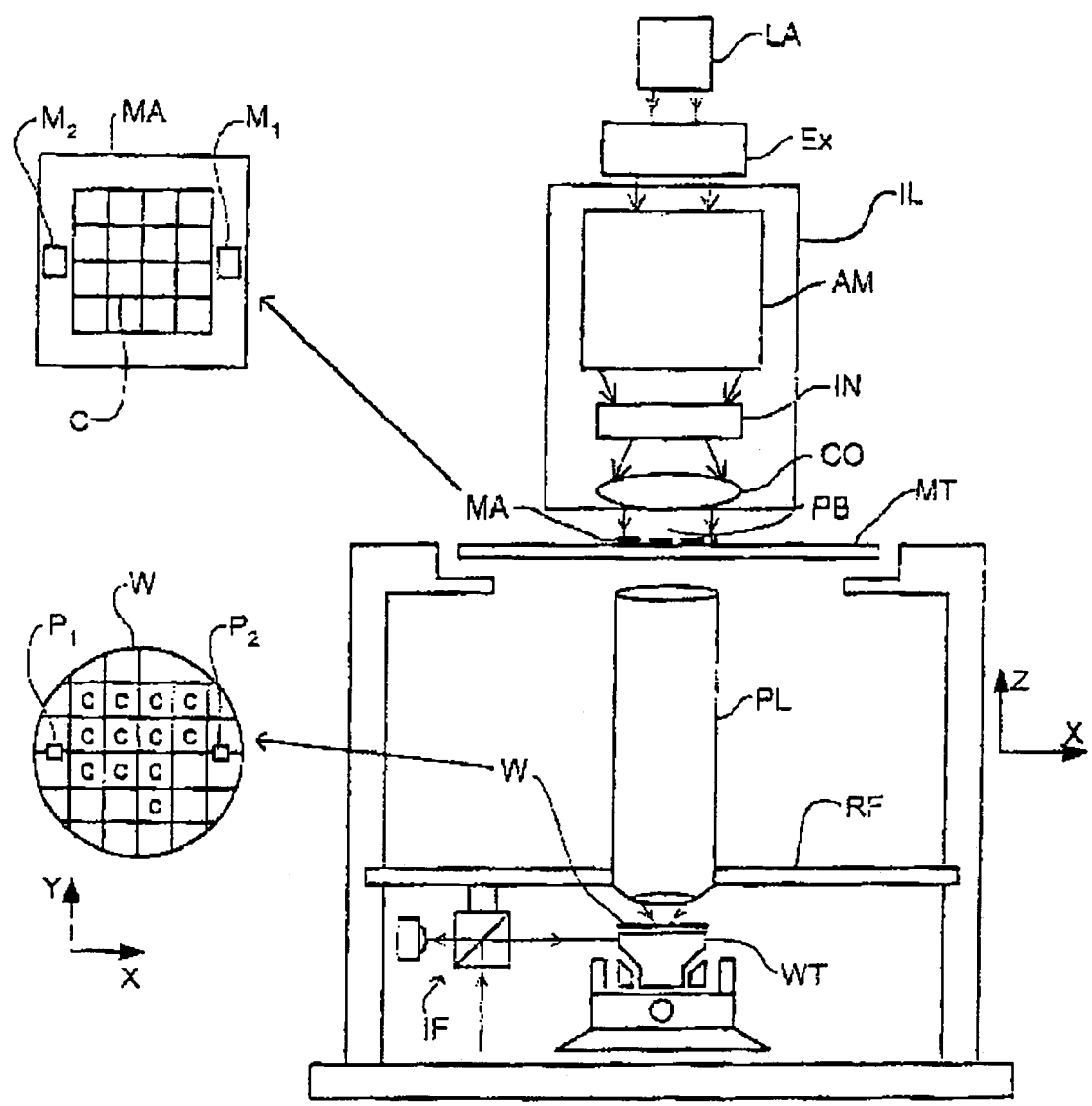
FIG. 1 depicts a lithographic projection apparatus according to an embodiment of the invention.

FIG. 1 schematically depicts a lithographic projection apparatus according to a particular embodiment of the invention. The apparatus includes: a radiation system Ex, IL, for supplying a projection beam PB of radiation (e.g. light in the deep ultraviolet region). In this particular case, the radiation system also includes a radiation source LA. The apparatus also includes a first object table (mask table) MT that is provided with a mask holder for holding a mask MA (e.g. a reticle), and connected to a first positioning device PM for accurately positioning the mask with respect to item PL; a second object table (wafer table) WT that is provided with a holder for holding a substrate W to be irradiated a by patterned beam onto a target portion of the wafer (e.g. a resist coated silicon wafer), and connected to a second positioning device PW for accurately positioning the substrate with respect to item PL; and a projection system ("lens") PL for imaging an irradiated portion of the mask MA onto a target portion C (e.g. comprising one or more dies) of the substrate W. It is understood that the term "table" defines any type of support that may be configured to support an object.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA (e.g. an excimer laser source) produces a beam of radiation. This beam is fed into an illumination system (illuminator) IL, either directly or after having traversed a conditioning device, such as a beam expander Ex, for example. The illuminator IL may include an adjusting device AM for setting the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
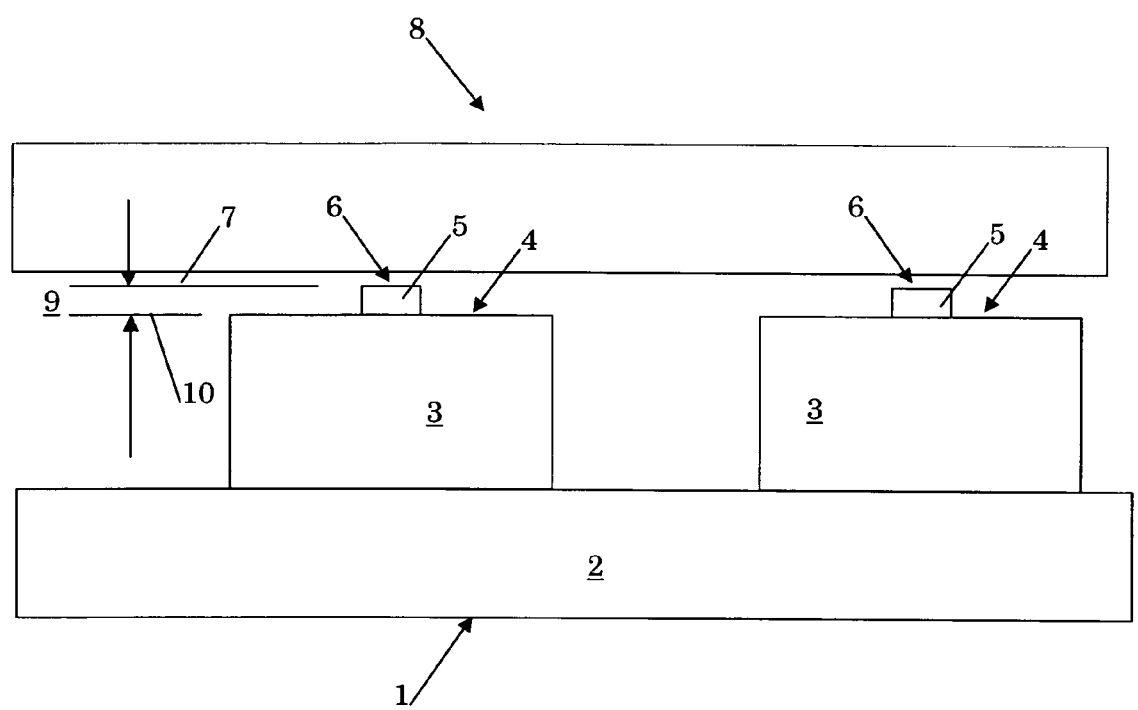
FIG. 2 depicts a partial schematic side-view of a substrate holder of the lithographic projection apparatus of FIG. 1.

FIG. 2 shows a partial schematic side-view of a substrate holder 1 according to the invention. In this partial view, the substrate holder, denoted as wafer table (WT) in FIG. 1, is referenced by numeral 1. The substrate holder includes a substantially flat base plate 2, usually made of SiC, SiSiC, a material known as ZERODUR® or Cordurite. On this base, first protrusions 3, also referred to as burls, are formed. The burls 3 may be of a cylindrical form, having a surface that is generally flat, in that the planes defined by the top faces 4 of the burls are substantially coincident. On the top faces 4 of the burls 3, second protrusions or so-called micro-burls 5 are formed. In this example, one micro-burl per protrusion is formed on the top face 4 thereof. However, more than one micro-burl may be present. These micro-burls 5 may be generally cylindrically formed and each have a second top face 6 defining a generally flat support surface 7 for a substrate 8 to be supported by the micro-burls 5. In FIG. 2 a gap 9, formed by the height of micro-burls 5, is denoted. This gap 9 defines a distance between a first contact surface 10, formed by the top faces 4 and the support surface 7, formed by second top faces 6 of the micro-burls 5. In FIG. 2, the substrate 8 is shown when the substrate 8 is not clamped to substrate holder 1. In this position, the gap between these contact-surfaces has a value in the range of about 50–80 nm. Furthermore, in the example shown in FIG. 2, the burls 3 are cylindrical with a diameter of about 0.5 mm, and the micro-burls 5 on top thereof are cylindrical with a diameter of about 0.05 mm.

Figure 3:
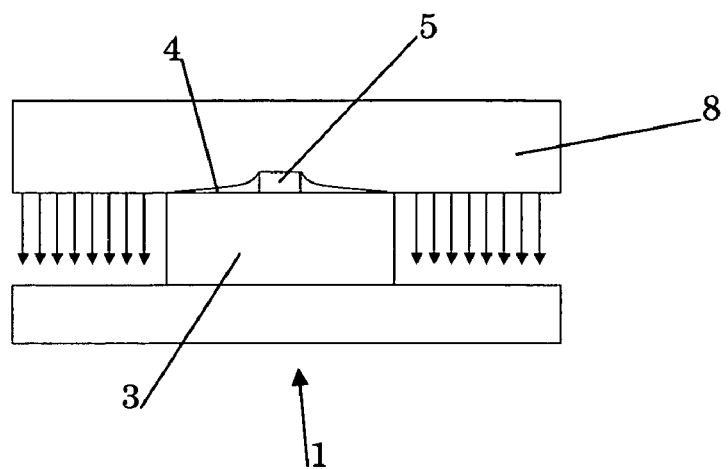
FIG. 3 depicts a partial schematic side-view of part of the substrate holder of FIG. 2, where a clamping pressure is applied on the substrate, thereby closing a distance between a first protrusion and a second protrusion.
Figure 4:
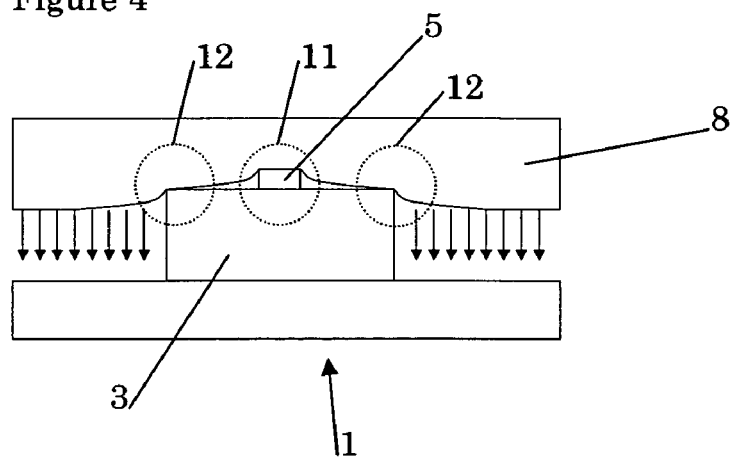
FIG. 4 depicts a partial schematic side-view of the substrate holder of FIG. 3, when a full clamping pressure is applied.
Figure 5:
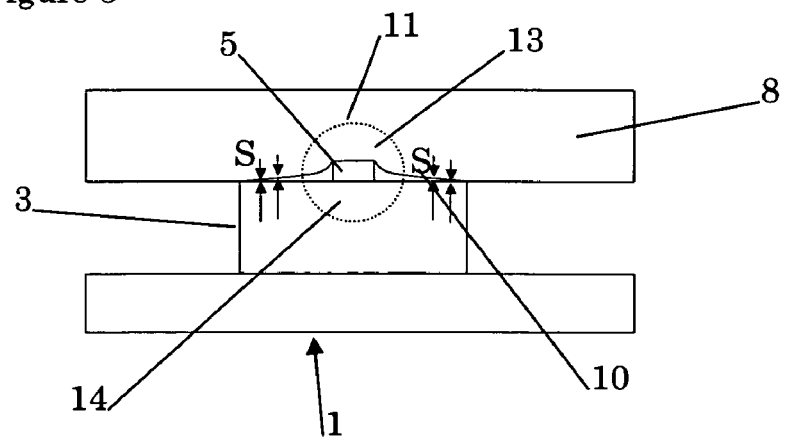
FIG. 5 depicts a partial schematic side-view of the substrate holder of FIG. 4, when the clamping pressure is removed.

FIGS. 3–5 show schematically the deformation process of a substrate 8 that is clamped on the substrate holder 1 according to the invention. In FIG. 3, a clamping pressure, such as a vacuum load that ranges from 0 bar (no load applied) to typically about 0.5 bar, is applied on the substrate 8. Initially, while applying increasing pressure, the substrate 8 deforms elastically, so that the micro-burl 5 protrudes into the substrate 8. In this way, the substrate 8 is lowered and contacts the substrate holder 1, and the micro-burl 5 is pushed into the substrate 8. For reasons of simplicity, only the deformation of the substrate 8 is shown in FIG. 3. It shall be understood, however, that depending on the relative moduli of deformation, elastic deformation may occur in this process, both on the face 4 of the burls 3 and on the side of the substrate 8 that contact the (micro-) burls 3(5). Furthermore, FIG. 3 illustrates the position where there is applied just enough pressure to close the gap 9 depicted in FIG. 2.

In addition, FIG. 4 depicts a partial schematic side-view of the substrate holder 1 when a full clamping pressure is applied. Here, the elastic deformation of the substrate 8 near the edges 11 of the micro-burls 5 is generally unchanged, where the elastic deformation of the substrate 8 near the edges 12 of the burls 3 is increased to a maximum stress value. Here, in an optimal configuration, the stress values near the edges of burls 3 and micro-burls 5 are of a generally same magnitude, which are preferably designed well below a maximum deformation tolerance of the substrate holder 1 and substrate 8.

FIG. 5 shows the momentary situation where the clamping pressure is fully released, so that the substrate 8 is no longer pressed against the substrate holder 1. At this moment, sticking forces, schematically illustrated with arrows S, may prevent the substrate 8 from releasing from the substrate holder 1. However, due to the elastic energy stored in the compressed area 11 in and around the micro-burl 5 (including a compressed zone 13 in the substrate 8, the micro-burl 5 itself and a supporting zone 14 of the micro-burl 5 near the top face 4 of the burls 3), a releasing force is present countering the sticking forces S. The micro-burls 5 are designed such that enough elastic energy is present to release the substrate 8 from the top face 4 of the burls 5 and to separate substrate 8 from the contact surface 10.

Figure 6:
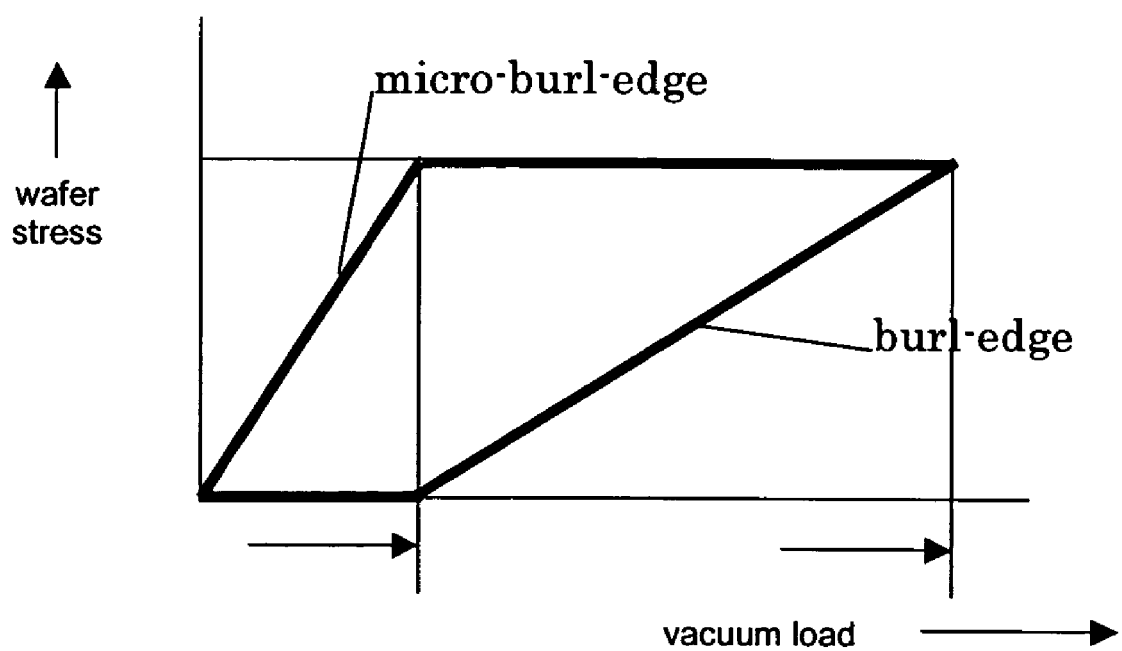
FIG. 6 depicts a schematic graph illustrating pressure build up in a substrate supported by the substrate holder of FIGS. 2–4 during application of the increasing clamping pressure.

FIG. 6 depicts a schematic graph illustrating a modeled stress build up in the substrate during application of increasing clamping pressure. Following the increase of pressure, schematically depicted in FIGS. 3–5, in FIG. 6, the stress build up is depicted for the compressed zone 11 near the micro-burl 5 (upper line) and for a zone 12 near the edges of the burl 3 referenced in FIG. 4 (lower line). Initially, only a top face 6 of micro-burl 5 is in contact with the substrate 8 and stress build up in zone 12 is still absent. In contrast, the stress builds up in zone 13 when contact is made. At that time, stress build up in zone 11 stops. Stress build up in zone 12 continues, and may become equal, smaller or larger than the stress in zone 11.

Here, it is assumed the stress build-up near this zone is inversely proportional to a burl-diameter. Furthermore, it is assumed that the stress and substrate deflection are proportional to the applied load (elastic deformation). In a practical experiment, sticky loads of 0.025N per burl were measured. For a wafer that is 0.725 mm thick and a Young's modulus of 110 GPa, for a normal stress level of 0.5 bar vacuum pressure and 0.5 mm burl diameter, a deflection of 80 nm and a load of 0.4 N per burl is calculated.

From this value, it can be deduced that a burl having a diameter of 0.05 nm, under the same load conditions, would push 800 nm into the substrate, yielding a 10 times higher stress level than the normal stress level. Rescaling the stress level to normal implies that the acceptable load is 0.04 N for a micro-burl of 80 nm height. This micro-burl-maximum load of 0.04 N is well above the sticky force-level of 0.025 N per burl. For a sticky force of 0.025 N this means that the deflection of the substrate is 50 nm—leaving a gap of 30 μm. Under normal load conditions, 10% of the weight of the load is carried by the micro-burl (0.04N)—leaving 0.36 N for the burl top face.

In the following illustrative examples, minimal, maximal and optimum heights are given for the micro-burls as illustrated with reference to FIG. 3–FIG. 6. Herein, Tables 1–3 represent design values for a 0.5 bar clamping pressure, where Tables 4–6 represent design values for a 0.2 bar clamping pressure.

Table 1 below lists the minimum gap as a function of sticking force and relative micro burl diameter for 0.5 Bar clamping pressure. The minimum gap is smaller for larger micro burl diameter, and larger for larger sticking force.

TABLE 1

| Sticking force [N] | Relative micro burl diameter [Dmicroburl/Dburl] | | | | | |
|---|---|---|---|---|---|---|
| | 0.008 | 0.025 | 0.05 | 0.1 | 0.25 | 0.5 |
| 0.0025 | 63 | 20 | 10 | 5 | 2 | 1 |
| 0.010 | 250 | 80 | 40 | 20 | 8 | 4 |
| 0.025 | 625 | 200 | 100 | 50 | 20 | 10 |
| 0.10 | 2500 | 800 | 400 | 200 | 80 | 40 |
| 0.25 | 6250 | 2000 | 1000 | 500 | 200 | 100 |

Table 2 below lists the optimum gap for 0.5 Bar clamping pressure, when the wafer stress caused by the micro burl is equal to the stress caused by the normal burl. For larger sticking forces, larger relative micro burl diameters are required.

TABLE 2

| Sticking force [N] | Relative micro burl diameter [Dmicroburl/Dburl] | | | | | |
|---|---|---|---|---|---|---|
| | 0.012 | 0.025 | 0.05 | 0.1 | 0.25 | 0.5 |
| 0.0025 | | 20 | 40 | 80 | 200 | 400 |
| 0.010 | | | 40 | 80 | 200 | 400 |
| 0.025 | | | | 80 | 200 | 400 |
| 0.10 | | | | | 200 | 400 |
| 0.25 | | | | | | 400 |

Table 3 below lists the maximum gap for 0.5 Bar clamping pressure, where wafer stress from the micro burl is ten times larger than the wafer stress from the normal burl. Again, for larger sticking forces larger relative micro burl diameters are required.

TABLE 3

| Sticking force [N] | Relative micro burl diameter [Dmicroburl/Dburl] | | | | | |
|---|---|---|---|---|---|---|
| | 0.012 | 0.025 | 0.05 | 0.1 | 0.25 | 0.5 |
| 0.0025 | 64 | 200 | 400 | 800 | 2000 | 4000 |
| 0.010 | | 200 | 400 | 800 | 2000 | 4000 |
| 0.025 | | 200 | 400 | 800 | 2000 | 4000 |
| 0.10 | | | 400 | 800 | 2000 | 4000 |
| 0.25 | | | | 800 | 2000 | 4000 |

Table 4 below lists the minimum gap as a function of sticking force and relative micro burl diameter for 0.2 Bar clamping pressure.

TABLE 4

| Sticking force [N] | Relative micro burl diameter [Dmicroburl/Dburl] | | | | | |
|---|---|---|---|---|---|---|
| | 0.008 | 0.025 | 0.05 | 0.1 | 0.25 | 0.5 |
| 0.0025 | 5 | 2 | 1 | 0 | 0 | 0 |
| 0.010 | 20 | 6 | 3 | 2 | 1 | 0 |
| 0.025 | 50 | 16 | 8 | 4 | 2 | 1 |
| 0.10 | 200 | 64 | 32 | 16 | 6 | 3 |
| 0.25 | 500 | 160 | 80 | 40 | 16 | 8 |

Table 5 below lists the optimum gap as a function of sticking force and relative micro burl diameter for 0.2 Bar clamping pressure.

TABLE 5

| Sticking force [N] | Relative micro burl diameter [Dmicroburl/Dburl] | | | | | |
|---|---|---|---|---|---|---|
| | 0.012 | 0.025 | 0.05 | 0.1 | 0.25 | 0.5 |
| 0.0025 | 6.4 | 20 | 40 | 80 | 200 | 400 |
| 0.010 | | 20 | 40 | 80 | 200 | 400 |
| 0.025 | | 20 | 40 | 80 | 200 | 400 |
| 0.10 | | | 40 | 80 | 200 | 400 |
| 0.25 | | | | 80 | 200 | 400 |

Table 6—Maximum gap as a function of sticking force and relative micro burl diameter, for a 10 times larger wafer stress from micro burl than from normal burl for 0.2 Bar clamping pressure.

TABLE 6

| Sticking force [N] | Relative micro burl diameter [Dmicroburl/Dburl] | | | | | |
|---|---|---|---|---|---|---|
| | 0.012 | 0.025 | 0.05 | 0.1 | 0.25 | 0.5 |
| 0.0025 | 64 | 200 | 400 | 800 | 2000 | 4000 |
| 0.010 | 64 | 200 | 400 | 800 | 2000 | 4000 |
| 0.025 | 64 | 200 | 400 | 800 | 2000 | 4000 |
| 0.10 | | 200 | 400 | 800 | 2000 | 4000 |
| 0.25 | | 200 | 400 | 800 | 2000 | 4000 |

The skilled artisan will appreciate that, in the context of such alternative applications, any use of the terms "reticle" or "wafer" or "substrate" in this text should be considered as being replaced by the more general terms as any article to be placed in the beam path. Such an article may encompass a patterning device, the patterning device serving to impart the projection beam with a pattern in its cross-section or a substrate to be patterned by a patterned beam onto a target portion of the substrate. In addition the following definitions are given to illustrate general and specific contexts of certain concepts that are used in this text. The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-adressable mirrors. The required matrix addressing can be performed using suitable electronic devices. In both of the situations described hereabove, the patterning device can include one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer)

that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

Further, the lithographic apparatus may be of a type having two or more wafer tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

While specific embodiments of the invention have been described above, it will be appreciated that the invention may be practiced otherwise than as described. For instance, where the examples describe the substrate holder as a wafer table, for holding a substrate to be patterned by a patterned beam onto a target portion of the substrate, in some embodiments (particularly, in embodiments using a reflective mask), also, the substrate holder may be a support for supporting the patterning device, the patterning device serving to impart the projection beam with a pattern in its cross-section. The description is not intended to limit the invention.

What is claimed is:

1. A lithographic projection apparatus comprising:
    a radiation system for providing a beam of radiation; and
    a substrate holder for supporting a substrate to be placed in a beam path of said beam of radiation, the substrate holder comprising a plurality of first protrusions, the distal ends thereof defining a first contact surface for contacting the substrate, and a plurality of second protrusions, the distal ends thereof defining a second contact surface for supporting said substrate;
    wherein said second protrusions are arranged so that (1) the substrate contacts said first and said second contact surfaces when the substrate is clamped against the substrate holder, and (2) the substrate is supported by said second contact surface and distanced from said first contact surface when the substrate is not clamped.

2. A lithographic projection apparatus according to claim 1, wherein at least one of said plurality of second protrusions is arranged on top of at least one of said plurality of first protrusions.

3. A lithographic projection apparatus according to claim 1, wherein said second contact surface is smaller than said first contact surface.

4. A lithographic projection apparatus according to claim 1, wherein at least one of said first protrusions is provided with one or more second protrusions.

5. A lithographic projection apparatus according to claim 1, wherein said first and second protrusions are cylindrical.

6. A lithographic projection apparatus according to claim 1, wherein a ratio of diameters of said second protrusions and first protrusions is between about 0.01 and about 0.5.

7. A lithographic projection apparatus according to claim 1, wherein a distance between said first and second contact surfaces is between about 6 and about 400 nm when the substrate is not clamped against said first contact surface.

8. A lithographic projection apparatus according to claim 1, wherein said substrate holder is a support table for holding a substrate to be patterned by a patterned beam onto a target portion of the substrate.

9. A substrate holder for a lithographic projection apparatus, the substrate holder comprising:
    a plurality of first protrusions, the distal ends thereof defining a first contact surface for contacting a substrate; and
    a plurality of second protrusions, the distal ends thereof defining a second contact surface for supporting said substrate,
    wherein said second protrusions are arranged so that (1) the substrate contacts said first and said second contact surfaces when the substrate is clamped against the substrate holder and (2) the substrate is supported by said second contact surface and distanced from said first contact surface when the substrate is not clamped.

10. A substrate holder according to claim 9, wherein at least one of said plurality of second protrusions is arranged on top of at least one of said plurality of first protrusions.

11. A substrate holder according to claim 9, wherein said second contact surface is smaller than said first contact surface.

12. A substrate holder according to claim 9, wherein at least one of said first protrusions is provided with one or more second protrusions.

13. A substrate holder according to claim 9, wherein said first and second protrusions are cylindrical.

14. A substrate holder according to claim 9, wherein a ratio of diameters of said second protrusions and first protrusions is between about 0.01 and about 0.5.

15. A substrate holder according to claim 9, wherein a distance between said first and second contact surfaces is between about 6 and about 400 nm when the substrate is not clamped against said first contact surface.

16. A substrate holder according to claim 9, wherein said substrate holder is a support table for holding a substrate to be patterned by a patterned beam onto a target portion of the substrate.

17. A device manufacturing method comprising:

supporting a substrate with a substrate support, the substrate support comprising a plurality of first protrusions, the distal ends thereof defining a first contact surface for contacting the substrate, and a plurality of second protrusions, the distal ends thereof defining a second contact surface for supporting the substrate;

clamping the substrate to the substrate support so that the substrate contacts the first and second contact surfaces;

patterning a beam of radiation with a patterning device;

projecting the patterned beam of radiation onto a target portion of the substrate; and unclamping the substrate so that the substrate is supported by the second contact surface and distanced from the first contact surface.

* * * * *